United States Patent [19]

Antonuccio et al.

[11] Patent Number: 5,400,214
[45] Date of Patent: Mar. 21, 1995

[54] BRACKETS AND LEVERS FOR INSTALLING AND MAINTAINING MOTHERBOARDS IN COMPUTER SYSTEMS

[75] Inventors: Robert S. Antonuccio, Burlington, Mass.; William A. Izzicupo, Windham, N.H.

[73] Assignee: Sun Microsystems, Inc., Mountain View, Calif.

[21] Appl. No.: 973,097

[22] Filed: Nov. 6, 1992

[51] Int. Cl.[6] .......................... H05K 7/14; H05K 7/10; H05K 5/02; H01R 13/62
[52] U.S. Cl. ................................. 361/683; 361/754; 361/756; 361/759; 361/798; 361/825; 439/157; 439/160; 439/64; 181/150
[58] Field of Search ............... 439/157, 310, 372, 377, 439/160, 64; 361/679, 683–686, 724–727, 740–742, 746, 747, 753, 754, 756, 758, 759, 798, 799, 800, 801, 802, 818, 825–827, 814; 174/138 D, 138 G; 364/708.1; 312/223.2; 181/148, 150

[56] References Cited

U.S. PATENT DOCUMENTS 4,999,744 3/1991 Blankenship ................... 439/160 X
5,136,465 8/1992 Benck et al. .................... 361/683 X
5,138,526 8/1992 Chung Hsiang ................ 361/801 X
5,148,352 9/1992 Sekouri et al. ..................... 361/725
5,224,024 6/1993 Tu et al. ........................... 361/685 X Primary Examiner—Michael W. Phillips
Attorney, Agent, or Firm—Daniel Patch

[57] ABSTRACT

In a computer system requiring the CPU board to be installed and removed from the top of the chassis, there is included a CPU board installation and maintaining lever supported for movement from the base of the chassis and perpendicularly to the board when the board is installed. The board has an opening of a dimension to allow the board on installation and removal to passed over the lever into a position where contact with the lever will move the board into and out of its operative position without the need to use hardware on its installation and removal. Also included is a bracket having holding surfaces securing a speaker to the bracket and the bracket to the chassis, the latter holding surfaces allowing the bracket to assume a first position in the chassis and a second position away from the base of the chassis to create a suitable space for the installation and removal of the board to and from the chassis.

19 Claims, 6 Drawing Sheets

BRACKETS AND LEVERS FOR INSTALLING AND MAINTAINING MOTHERBOARDS IN COMPUTER SYSTEMS

BACKGROUND OF THE INVENTION

The present invention relates to computer systems and more particularly to an improvement in the way and manner of installing and maintaining the central processing unit (CPU) i.e. CPU board in the base or box of the computer. It also relates to an improved way and manner for attaching speakers to the systems, particularly in systems where adhesives or screws can not be employed or are not desirable because of certain conditions of the systems, and includes an improved way and manner of supporting and routing of the light energy diodes (LED) to the systems.

while in the past a lever assembly or an ejector have been employed to install and maintain the CPU board in its operational position, these past elements, however, required space that is not .available in new systems being developed, particularly where the systems require the installation of the CPU boards where the levers must be mounted perpendicularly to the CPU boards. Past levers have been found unacceptable also due to their inability to adequately hold the boards in their required operating positions when subject to normal operational shock and vibration.

In past techniques for securing the speakers the fasteners would not rigidly hold the speakers, which condition adversely affected the acoustic performance, particularly of large higher power speakers. Also the previous use of employing ribs to support the speakers did not allow the speakers to be raised out of their boxes i.e. chassis to inoperative positions so that the CPU boards could be removed from the boxes with reference to both of the above noted past designs for installing and maintaining the CPU boards and supporting the speakers, another drawback was the fact that it was normally required to employ hardware to remove the boards and speakers and required the physical handling of the boards to insert the card edges of the boards into the card edge connectors after the computers left the manufacturer.

BRIEF SUMMARY OF THE INVENTION

It is an object of the invention to provide in a computer system an improved CPU board installing and maintaining mechanism and method thereof.

It is another object of the invention to provide in a computer system an improved speaker supporting and maintaining mechanism and method thereof.

It is a still further object of the invention to provide in a computer system a lever mechanism for the CPU board and a bracket mechanism for the speaker, both designed to allow quick installation and removal and positive maintenance of the CPU board without the need of the use of hardware and without the need of removal of the mechanisms from the system, particularly in a system where the lever must be perpendicularly arranged to the board.

It is another object of the invention to provide an improved design and method to allow the speaker to be firmly secured to the aforesaid bracket and the wiring of an LED to the speaker, again without the use of hardware.

BRIEF DESCRIPTION OF THE DRAWINGS

The above objects and advantages of the invention and others will be better understood when the following description of the preferred embodiment of the invention is read along with the accompanying drawings of which.

DETAIL DESCRIPTION OF THE INVENTION

Figure 1:
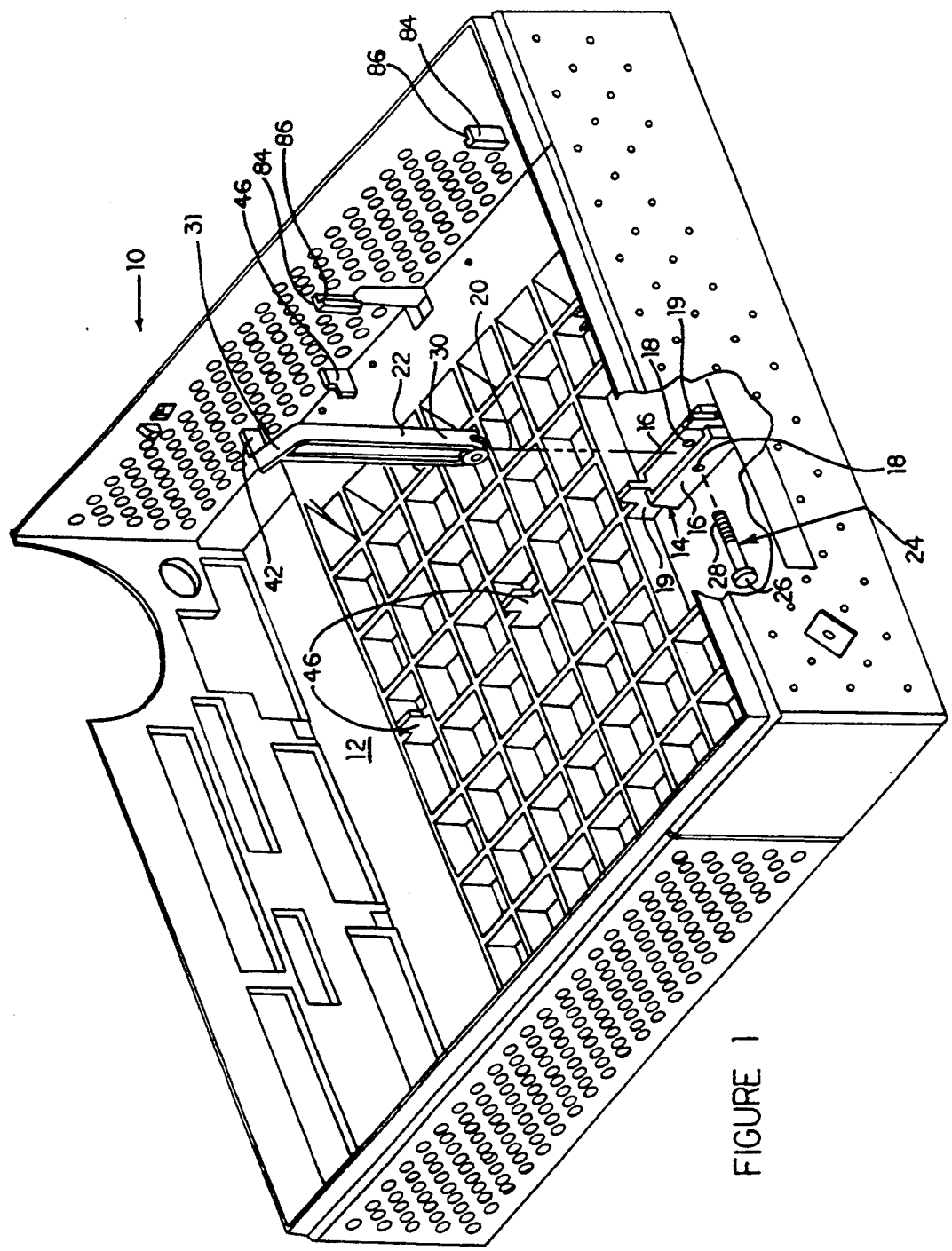
FIG. 1, is a perspective view of a box of a computer system illustrating the CPU board lever of the invention in its assembled position in the box with the cover of the computerremoved, FIGS. 2A, B and C, are perspective views of a box of a computer system, illustrated with the cover of the computer system removed and showing match lines for the CPU board, the speaker and bracket of the invention in their assembled positions with respect to the box.

With reference to FIG. 1, there is illustrated a chassis or box 10 of a computer system of the type used in a work station. The box is shown with the cover and CPU board removed for clarity. At the base 12 in the interior of the box 10 a bracket 14 is formed as part of the box having two parallelly extending spaced apart upright members 16, each having aligned openings 18 and at its opposite narrow sides projecting stop members 19. As indicated by the dot dash lines 20, the bottom portion of a CPU band installation lever 22 (or movement imparting member) is adapted to fit into the space formed by the members 16 and pivotally secured thereto and supported therein by a pin 24 when passed through the openings 18, the members 16 serving as movement directional controlling members. At one end of the pin 24 it is provided with an enlarged end 26 to prevent it from passing through the openings 18 in one direction. The other end of the pin has a length that extends beyond the adjacent member 16 where the pin 24 takes the form of a hook shaped member 28, the open part of the hook being readily flexible so that it can be collapsed when the pin is inserted into the openings 18, after which the flexible part is allowed to spring back to lock the pin 24 and lever 22 to the base 12 of the box 10.

Figure 3:
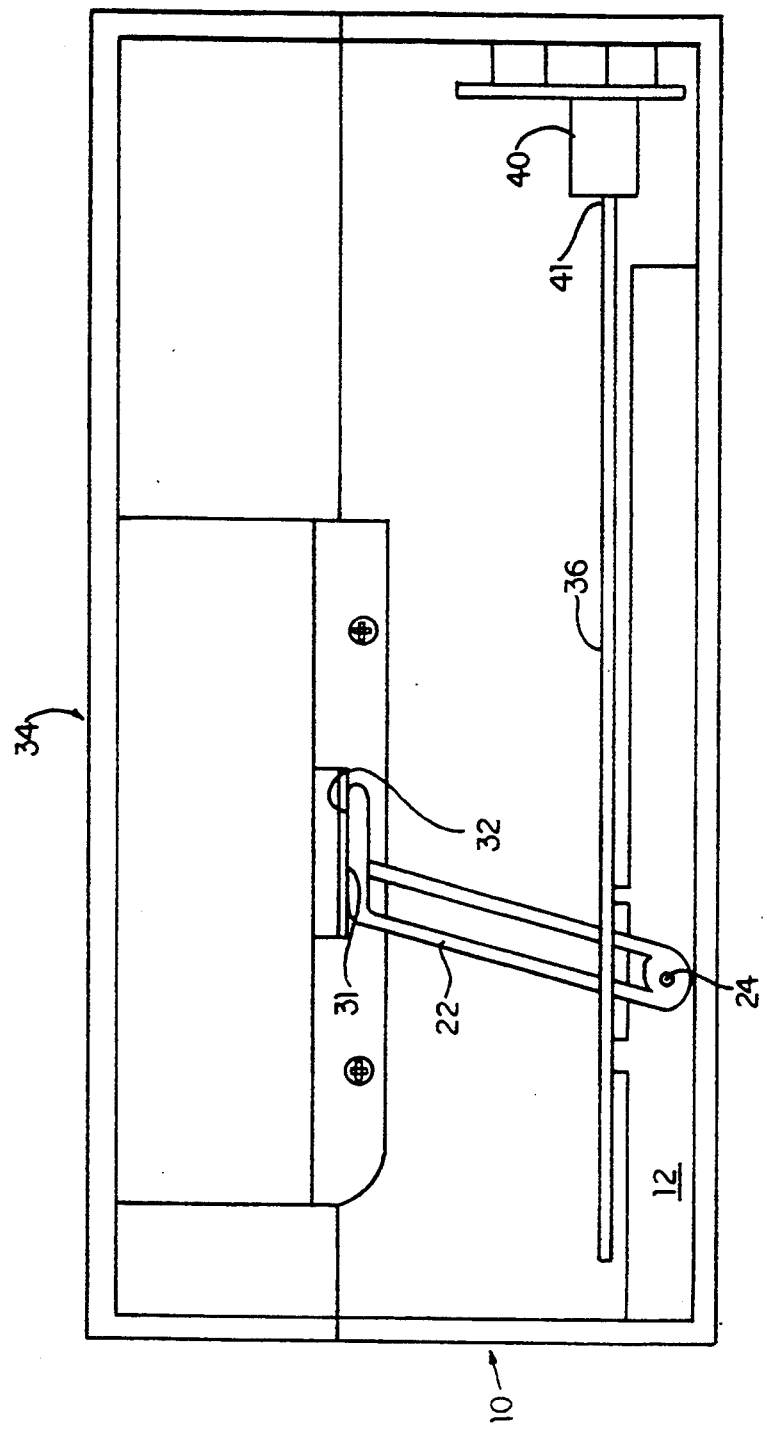
FIG. 3, is a schematic elevational view illustrating the installation and maintaining lever of the invention in relation to a contact surface of the cover of a computer system.

The lower part of the lever 22 is formed with opposed flat surfaces 30 that are designed to contact the stops 19 which limit the movement of the lever in the direction longitudinally, as one views the box 10 in FIG. 1. The lever 22 extends upwardly to an upper portion, which is formed with an inclined cam acting surface 31 sloped towards the reader, which in the operative position of the lever is contacted by a contact surface 32 provided on the interior of the underneath surface of the cover 34, shown best in FIG. 3. This contact prevents any movement of the lever after the cover 34 is installed thereby to maintain the CPU board in its operative position, even when subject to operational shock and vibration.

Figure 2A:
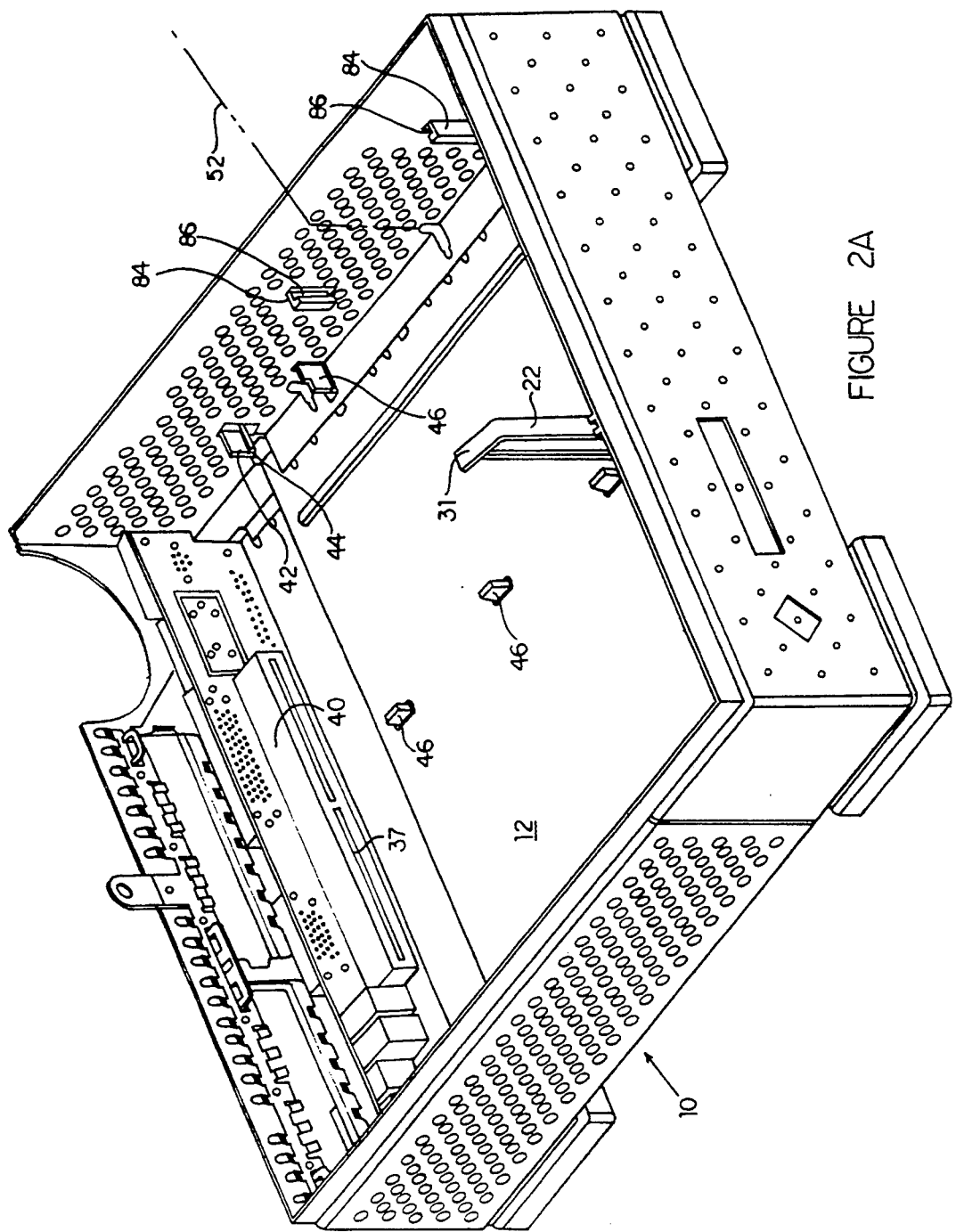
Figure 2B:
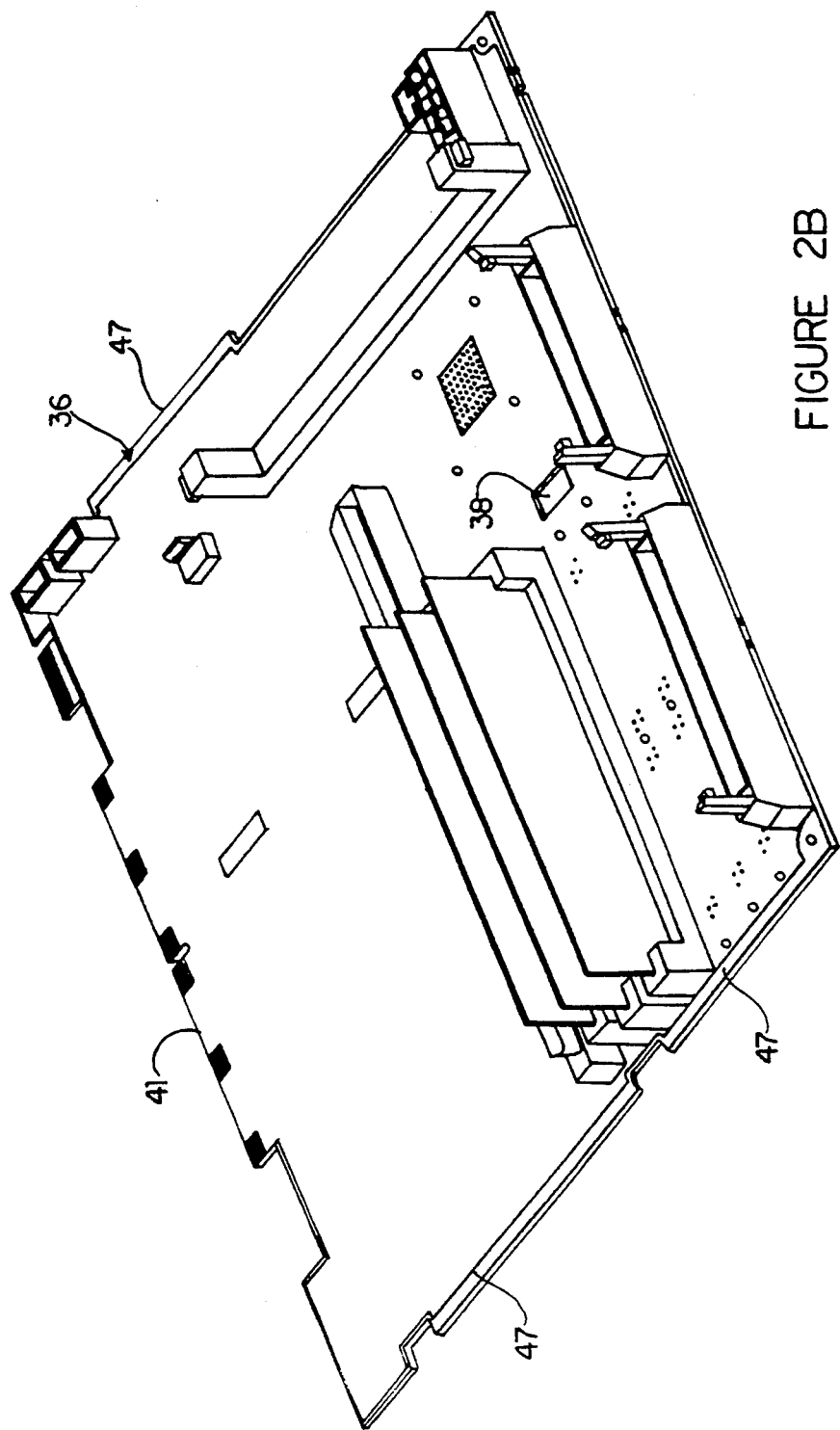

For the purpose of providing quick, positive and easy movement of the CPU board into and out of its operative position there is provided in the board indicated at 36, which is shown only in FIG. 2B, a rectangular opening 38 as one looks down on the board from above.

When the board is lowered from the top of the box 10 into the box, the lever 22 will have been positioned in its rearward position i.e. inoperative position after which it can be moved by hand from right to left as one views FIG. 2A causing a corresponding longitudinal movement of the CPU board 36. In the usual manner the system is provided with a CPU card edge connector designated 40 in FIGS. 2A and 3 having a slot 37, into which the CPU card edge 41, shown only in FIG. 2B, of the board is inserted by the lever 22, this inserted position being sometimes referred to as the operative position of board 36.

During this movement in installing the board 36, in addition to the guiding and restraining influence that the four vertical surfaces of the lever 22 will furnish with the adjacent corresponding surfaces of the opening 38, the board is guided and restrained in its desired position during its movement by four projecting tabs 42, one of which is shown in FIGS. 1 and 2A, two such tabs being provided at spaced intervals on the two opposed transverse walls of the box 10. As viewed in FIG. 2A, it will be noted that at the bottom of the tabs 42, the tabs have tapered projections 44, the underneath tapered surfaces of which facing the adjacent upper surface of the board can be engaged by the board on the movement thereof to assist in controlling the movement of the board, both in longitudinal and transverse directions. FIGS. 1 and 2A also show that the board 36 is supported in the box by a support facility in the form of several upright members 46, only a limited number of which are illustrated. It should also be pointed out that the board, as shown in FIG. 2B, on its two transverse sides is provided with transversely extending portions 47 having longitudinal lengths that allow contact with the tapered projections 44 during the board's movement toward and away from the CPU card edge connector 40.

In installing the board 36, the lever 22 is positioned in a generally upright vertical position slightly toward the side opposite the card edge connector 40 (i.e. at the rear side of the box) so that as the board is lowered from the top of the box 10 its side opposite the card edge 41 is close to the rearward side of the box 10. This allows the board to pass quickly and easily over the top of the lever which will position the card edge 41 of the board slightly away from the card edge connector 40 while supported by the members 46 at the same elevation as the slot 37 of the card edge connector 40. Once so positioned, the lever 22 can be moved by hand in a positive guiding manner to in turn move the board into its operative position relative to the card edge connector 40. The use of the lever thus avoids any need to touch the board with human hands, particularly when the computer is being serviced after its leaves the manufacturer.

Figure 2C:
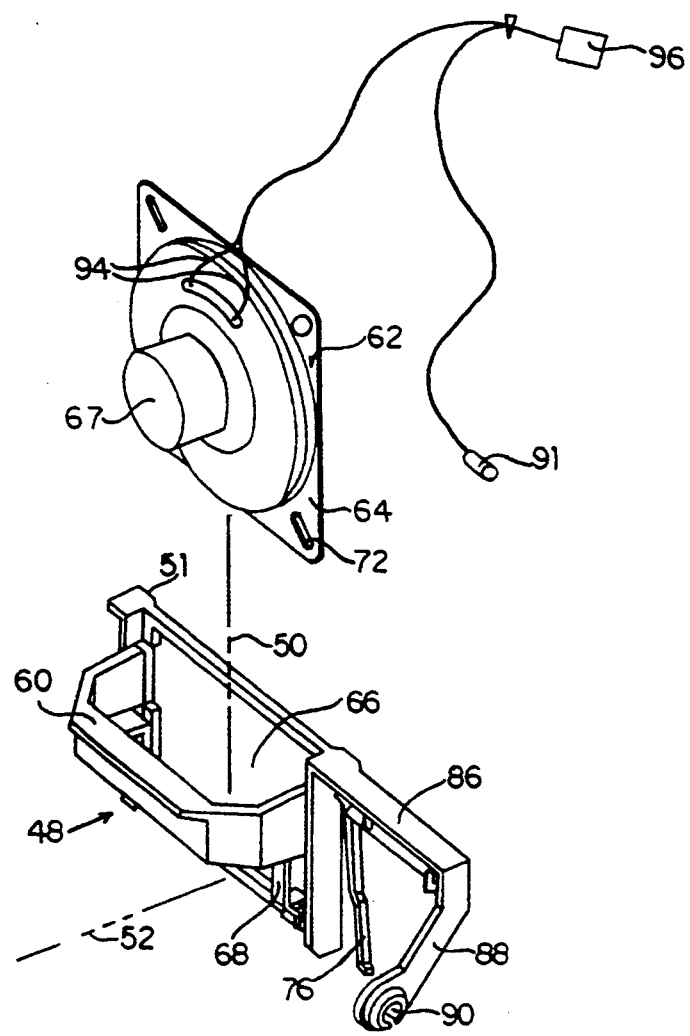
Figure 4:
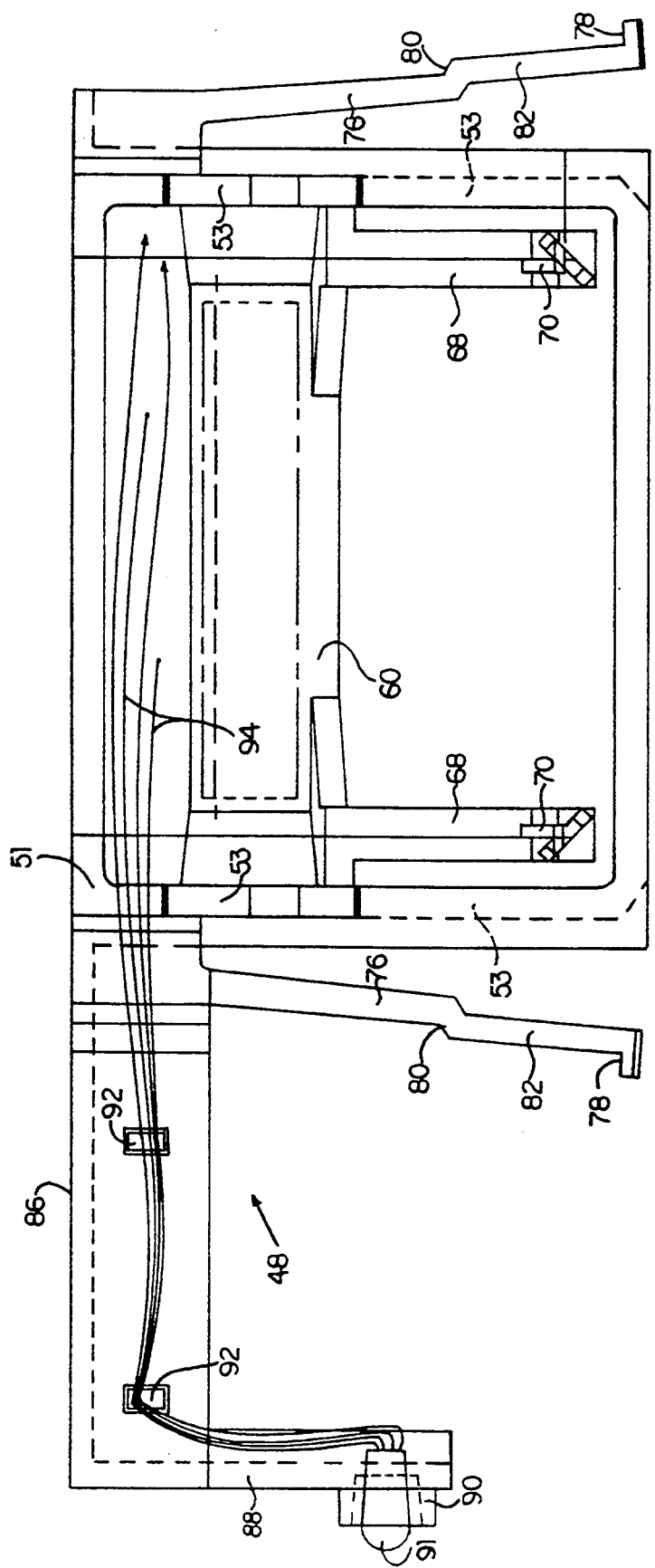
FIG. 4, is an elevational view of the speaker bracket of the invention viewed from the rear side of the bracket employed in a computer system.

With reference now to FIG. 4, there is illustrated a speaker bracket 48 designed to allow, without the use of any hardware i.e. tools, a speaker 62, shown in FIG. 2C, to be mounted in the bracket 48 and the bracket in the chassis 10 and held securely but yet allowed to be moved when desired to a position to permit removal of the CPU board 36, again without tools. In addition the bracket allows the support and routing of the wiring for an LED that will permit insertion and removal of the CPU board without disturbing these elements. The general contour and characteristics of the bracket 48 are illustrated in FIG. 2C, in which by match lines 50 and 52 (line 52 also appearing in FIG. 2A) the assembled relationships of the bracket to the chassis 10 and the speaker to the board 36 are indicated. It should be noted that FIGS. 2B and 2C illustrate some of the usual components of the computer system not involved with the invention. The bracket 48 is formed to have a back section 51 which in its operative position extends in a vertical direction in contact with and parallel to one of the vertical side walls of the box 10. Inward from the back section 51 two vertical opposed guiding surfaces 53 are provided in the bracket, indicated best in FIGS. 4.

When viewed from the back of the bracket the upper most guiding surfaces appear open and the lower most guiding surfaces appear open when viewed from the front of the bracket, the upper surface being formed by a central longitudinal projecting section 60 of the bracket 48. In this construction the surfaces 53 create slots which form opposite vertical holding surfaces for the opposite sides of the speaker 62, the speaker being tightly engage between the surfaces 53 of the slots, the spaces between the surfaces being dimensioned to create a strong frictional contact with the frame 64 of the speaker 62 as it is slid into the slots and is forcibly held thereby. As shown best in FIG. 2C, the central section 60 projects horizontally and is provided with a sufficient opening 66 to receive the front projecting member 67 of the speaker 62. Extending downwardly from the bottom of central section 60 are two parallelly arranged arms 68 having at their extreme lower ends projecting speaker holding elements 70, which are designed to pass into and through oblong openings 72 (only one being shown in FIG. 2C) provided at the bottom of the frame 64 of the speaker in such a manner to grip the frame 64 and hold it securely from vertical movement relative to the bracket 48. The arms 68, as shown in FIG. 4, are relatively slender so that they have a desired degree of flexibility and as a result when the frame 64 of the speaker 62 is forced down the slots formed by the surfaces 53 and the openings 72 are brought into alignment with the elements 70, the elements snap into the openings 72 and have a tendency to remain their until the elements are forced out of the openings by hand pressure.

At the back section 51 of the bracket 48 there are two additional arms 76 which extend downwardly from the top of the bracket in a generally parallel direction and form an integral part with the back section and terminate at a location at the bottom of the back section, as can be seen from FIG. 4. The arms 76 are spaced from the adjacent vertical sides of the bracket 48 and are limber enough to be deflectable towards the sides of the bracket. At the very bottom of the arms 76 they are provided with horizontally projecting feet 78 projecting away from the bracket. Generally, midway between the top and bottom of the arms 76 there are provided holding surfaces 80 formed by virtue of the arms having displaced or indented lower portions 82. These feet 78 are adapted to cooperate with bracket receiving members 84 provided in one of the side walls of the box 10, which can be best seen in FIGS. 1 and 2A. The members 84, as shown, are spaced apart and extend vertically relative to the wall and are provided with slots 86 that face each other. The slots 86 are dimensioned to receive the arms 76 in a manner to allow the bracket 48 to assume a vertical position relative to the chassis 10.

In an upper or first operative position the bracket 48 can be raised by hand until the upper portions of the feet 78 hit against the receiving members 84. If the bracket is to be removed altogether from the chassis, the arms 76 need only be forced by hand inwardly to cause the feet 78 to move within the openings of the slots 86, whereupon the bracket is free to be vertically removed for the chassis. It is in the so called inoperative position of the bracket 48 that a space is provided between the bracket and the CPU board 36 that allows the board to be installed or removed without interference with the bracket, speaker, and/or LED wiring.

In a lower or second operative position of the bracket 48, the particular shape of the arms 76 allows the holding surfaces 80 to snap into holding engagement with the lower surfaces of the receiving members 84 firmly locking the bracket in its operative position, in which the top surfaces of the bracket 48 and speaker 62 are generally totally received in the box 10 in position for the cover 34 to be inserted on the box.

FIGS. 2C and 4, also shows the feature of the invention of employing the bracket 48 to carry and support a LED and its wiring in a manner that, as with the speaker 62, it will not interfere with the installation of the CPU board 36 when it must be installed from the top of the box 10. FIG. 4, which is looking from the back of the bracket in its relationship to the box 10, shows that the bracket 48 has an arm 86 extending horizontally from the top of the bracket and has a downward portion 88 with a slotted boss for snugly receiving in an opening 90 of the boss an LED 91, also appearing in FIG. 2C. The wiring for the LED is shown supported and held by the openings of oppositely arranged holding elements 92 formed on the vertical surface of the arm 86. It will be appreciated that while the wiring is shown mounted at the back of the arm 86, in practice it will be mounted on the front allowing the arm and bracket to contact and be restrained by the wall of the box. The wiring, including the wiring required for the speaker 62, is carried by clips secured to the front of the arm 86, two such leads being indicated at 94 in FIGS. 2C and 4. The opposite end of the wiring will include the usual connector, shown only in FIG. 2C at 96.

It should be noted that the lever and bracket may be formed from a polymer of the type generally used for other components of the computer system.

In accordance with the patent statutes, we have explained our invention in terms of its preferred embodiment, however, it will be readily understood by those skilled in the art to which the invention pertains that it may be practiced otherwise than illustrated and described.

We claim:
1. A computer system having a chassis in the form of a rectangular box with closed integral sides and bottom and a CPU board, said chassis having an open top for receiving said board comprising:
a movement imparting member for installing and maintaining said board in an operating position,
a support member, included in said bottom, supporting said movement imparting member,
said movement imparting member having an extending portion extending from said support member in the direction of said open top of said chassis, and
said board having a surface engaged by said extending portion whereupon on movement of said extending portion movement of said board is effected to cause said installation of said board and maintenance of said board in its operating position.
2. A computer system according to claim 1, wherein said system includes a speaker,
a holding member securing said speaker to one of the sides of said chassis, and
said holding member including a positioning member positioning said holding member in first and second operative positions relative to said chassis.
3. A computer system according to claim 2, wherein said surface of said board is formed by an opening in said board,
said extending portion having a section that passes through said opening,
said extending portion includes at its end opposite said support member a contactable surface,
said system including a cover cooperatively arranged with said bottom to form an enclosed box, and
said cover having a surface formed to contact said contactable surface of said extending portion in a manner to prevent movement of said extending portion when said cover is mounted over said bottom.
4. A computer system according to claim 2,
wherein said support member includes a movement directional control member for directing said movement imparting member in an advancing movement to cause said board to be forced into said operating position and for directing said movement imparting member in a retracting movement to cause said board to be forced out of said operating position to a position where it can be removed from said chassis,
second support members extending from said bottom arranged to support said board when said board is placed in said chassis while said board is in said operating position and out of said operating position, and
wherein said second support members include several such second support members arranged on the sides of said chassis parallel to the direction of movement of said board when moved to said operating position, and
at least two of said second support members including inclined surfaces arranged to effect a guiding and positioning of said board during said movement.
5. A computer system according to claim 2, wherein said holding member securing said speaker includes deflectable members securing said speaker to said holding member by the force created by deflection of said deflectable members, and
wherein said speaker includes openings for each said deflectable members and said deflectable members include projections, an associated opening and projection of each deflectable member being arranged to assume aligned positions with respect to each other when said speaker is in its secured position in said holding member, and
said projections being formed to snap into an associated said opening by said deflecting force to thereby firmly secure said speaker to said holding member without the use of hardware.
6. A computer system according to claim 5, wherein said holding member takes the form of a bracket and said deflectable members take the form of a pair of arms arranged outward of said speaker and extending towards the bottom of said speaker,
said arms including contacting portions allowing said bracket when said board is inserted in said chassis to assume a first position adjacent said board and in a second position spaced from said board when said board is so inserted, and wherein said chassis includes a pair of spaced apart engaging surfaces arranged in one of its sides, said arms including feet at their lower most ends formed to engage a different one of said engaging surfaces, said arms being formed to be deflectable towards said speaker when said speaker is carried by said bracket, said deflection being sufficient to force each of said feet to forcibly contact an associated said engaging surface to lock said bracket to said chassis in said first operative position, and said arms having similar indented sections midway between their opposite ends forming holding surfaces for engaging an associated said engaging surface to lock said bracket in said second operative position.

7. A computer system according to claim 2, including an LED, wherein said holding member securing said speaker takes a form of a bracket, said bracket including a member extending away from one side of said bracket, said extending member having a portion receiving and supporting said LED, and said bracket including a carrying member wiring for said LED and for said speaker.

8. A computer system according to claim 1, wherein said surface of said board is formed by an opening in said board, and said extending portion having a section that passes through said opening.

9. A computer system according to claim 1, wherein said extending portion includes at its end opposite said support member a contactable surface, said system including a cover cooperatively arranged with said bottom to form an enclosed box, and said cover having a surface formed to contact said contactable surface of said extending portion in a manner to prevent movement of said extending portion when said cover is mounted over said bottom to form said enclosed box.

10. A computer system according to claim 1, wherein said support member includes a movement directional controlling member for directing said movement imparting member in an advancing movement to cause said board to be forced into said operating position and for directing said movement imparting member in a retracting movement to cause said board to be forced out of said operating position to a position where it can be removed from said chassis.

11. A computer system according to claim 1, including a support facility extending from said bottom arranged to support said board when said board is placed in said chassis while said board is in said operating position and in an inoperative position.

12. A computer system according to claim 11, wherein said support facility includes at least two supports arranged on the sides of said chassis parallel to the direction of movement of said board when moved to said operating position, and at least one of said supports on each said opposite sides including inclined surfaces arranged to effect a guiding and positioning of said board during said movement.

13. A computer system having a chassis in the form of a rectangular-box with closed integral sides and bottom and a CPU board, said chassis having an open top for receiving said board, said system includes a speaker comprising:

a holding member securing said speaker to one of said sides of said chassis, and said holding member including a guiding member positioning said holding member in first and second operative positions relative to said chassis.

14. A computer system according to claim 13, wherein said holding member includes deflectable portions securing said speaker to said holding member by the force created by deflection of said deflectable portions.

15. A computer system according to claim 14, wherein said speaker includes openings and said deflectable portions include projections arranged to form cooperative sets, each said opening and projection of a said cooperative set being arranged to assume aligned positions with respect to each other when said speaker is in its secured position in said holding member, and said projections being formed to snap into an associated opening by said deflecting force to thereby firmly secure said speaker to said holding member without the use of hardware.

16. A computer system according to claim 14, wherein said holding member takes the form of a bracket having a pair of said deflectable portions arranged outward of said speaker and extending towards the bottom of said speaker, and said deflectable portions including contacting portions allowing said bracket to assume said first position adjacent said board when said board is inserted in said chassis and in said second position spaced from said board when said board is so inserted.

17. A computer system according to claim 16, wherein said chassis includes a pair of spaced apart engaging surfaces arranged on one of its sides, said deflectable portions being in the form of arms including feet at their lower most ends formed to engage a different one of said engaging surfaces, said arms being formed to be deflectable towards said speaker when said speaker is carried by said bracket, said deflection being sufficient to force each of said feet to forcibly contact an associated said engaging surface to lock said bracket to said chassis in said first operative position, and said arms having similar indented sections midway between their opposite ends forming holding surfaces for engaging an associated said engaging surface to lock said bracket in said second operative position.

18. A computer system according to claim 13, including an LED, wherein said holding member takes a form of a bracket, said bracket including a member extending away from one side of said bracket, said extending member having a portion receiving and supporting said LED, and said bracket including a carrying member carrying wiring for said LED and for said speaker.

19. A method of installing and maintaining a CPU board in a computer system having a chassis with closed integral sides and bottom, said chassis also having an open top, said system including a CPU board having a component carrying side facing said open top and a speaker comprising the steps of:

forming an opening in said board so that when said chassis is in a generally horizontal position said board will be generally horizontally positioned and in which case said opening extends with its axis in a generally vertical plane, mounting a lever at the base of said chassis, causing an extending portion of said lever to extend into and through said opening, causing said lever to contact said board when extended through said opening, in mounting said lever when said chassis is so positioned, arranging said lever so that said lever can be moved in a direction to effect a generally horizontal movement of said board to position said board in operative and inoperative positions in said chassis, mounting said speaker adjacent one of the sides of said chassis and on said component carrying side of said board when said board is positioned in said chassis, and causing the speaker so mounted to be displaceable to a first operative position adjacent said board and to a second operative position spaced from said board, in which in the second operative position said board is free to be installed and removed from said chassis with the lever still mounted in said chassis.

* * * * *